(12) United States Patent
Rudigier et al.

(10) Patent No.: US 9,845,527 B2
(45) Date of Patent: Dec. 19, 2017

(54) METHOD FOR PRETREATING SUBSTRATES FOR PVD METHODS

(71) Applicant: Oerlikon Trading AG, Trübbach, Trübbach (CH)

(72) Inventors: Helmut Rudigier, Bad Ragaz (CH); Jürgen Ramm, Maienfeld (CH); Beno Widrig, Bad Ragaz (CH); Troy Vom Braucke, Buchs (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 92 days.

(21) Appl. No.: 14/075,085

(22) Filed: Nov. 8, 2013

(65) Prior Publication Data
US 2014/0061034 A1    Mar. 6, 2014

Related U.S. Application Data

(63) Continuation of application No. 13/130,050, filed as application No. PCT/EP2009/064137 on Oct. 27, 2009.

(30) Foreign Application Priority Data

Mar. 30, 2009  (EP) .................................... 09004581

(51) Int. Cl.
*C23C 14/00* (2006.01)
*C23C 14/32* (2006.01)
(Continued)

(52) U.S. Cl.
CPC .......... *C23C 14/325* (2013.01); *C23C 14/022* (2013.01); *C23C 14/025* (2013.01); *H01J 37/32055* (2013.01); *H01J 37/32064* (2013.01)

(58) Field of Classification Search
CPC ... C23C 14/022; C23C 14/025; C23C 14/325; H01J 37/32055; H01J 37/32064
(Continued)

(56) References Cited

U.S. PATENT DOCUMENTS 4,288,306 A * 9/1981 Kieferle .................. C23C 14/22
                                                              204/192.38
4,734,178 A    3/1988 Gavrilov et al.
(Continued)

FOREIGN PATENT DOCUMENTS

CN    1063128 A    7/1992
CN    101175867 A    5/2008
(Continued)

OTHER PUBLICATIONS

Machine Translation of DE 4238784 Jan. 1994.*
(Continued)

*Primary Examiner* — Rodney McDonald

(57) ABSTRACT

The invention relates to a method for coating work pieces in a vacuum treatment system having a first electrode embodied as a target, which is part of an arc vaporization source. Using the first electrode, an arc is operated with an arc current and vaporizes material. A bias voltage is applied to a bias electrode, which includes a second electrode that is embodied as a work piece holder, together with the work pieces. Metal ion bombardment is carried out either to pretreat the work pieces or in at least one transition from one layer to an adjacent layer of a multilayer system, so that neither a significant material removal nor a significant material buildup occurs, but instead, introduces metal ions into a substrate surface or into a layer of a multilayer system.

22 Claims, 8 Drawing Sheets

Related U.S. Application Data

(60) Provisional application No. 61/115,569, filed on Nov. 18, 2008.

(51) Int. Cl.
*C23C 14/02* (2006.01)
*H01J 37/32* (2006.01)

(58) Field of Classification Search
USPC ........................................ 204/298.41, 192.38
See application file for complete search history.

(56) References Cited

U.S. PATENT DOCUMENTS

| | | | |
|---|---|---|---|
| 5,278,861 | A | 1/1994 | Damond et al. |
| 5,503,725 | A | 4/1996 | Sablev et al. |
| 6,083,356 | A * | 7/2000 | Goedicke .............. C23C 14/022 204/164 |
| 2008/0173536 | A1 | 7/2008 | Ramm et al. |
| 2008/0193782 | A1 * | 8/2008 | Ramm et al. ................. 428/469 |

FOREIGN PATENT DOCUMENTS

| | | |
|---|---|---|
| DE | 3390523 C2 | 8/1985 |
| DE | 4238784 C1 * | 1/1994 |
| EP | 1260603 A2 | 11/2002 |
| JP | 01042574 A | 2/1989 |
| JP | 08-222177 | 8/1996 |
| JP | 2008533686 A | 8/2008 |
| WO | 2006099754 A1 | 9/2006 |
| WO | 2006099760 A2 | 9/2006 |
| WO | 2007131944 A2 | 11/2007 |
| WO | 2010057747 A1 | 5/2010 |

OTHER PUBLICATIONS

Ramm et al. "Pulse enhanced electron emission (P3e™) arc evaporation and the synthesis of wear resistant Al—Cr—O coatings in corundum structure", Surface & Coatings Technology 202 (May 2007).*

Johnson, Philip C., "The Cathodic Arc Plasma Deposition of Thin Films," Physics of Thin Films, Academic Press, Inc., vol. 14, 1989, 71 pages.

Oks, E.M. et al., "Measurement of total ion current from vacuum arc plasma sources," Review of Scientific Instruments 77, 03B504, 2006, American Institute of Physics, 3 pages.

Büschel, M. et al., Influence of the pulsing of the current of a vacuum arc on rate and droplets, Surface and Coatings Technology. 2001, Elsevier Science B.V., pp. 665-668.

Aksenov, I.I. et al., "Transport of plasma streams in a curvilinear plasma-optics system," Sov. J. Plasma Phys. 4(4), (Jul.-Aug. 1978), American Institute of Physics, 1979, pp. 425-428.

Schönjahn, C. et al., "Optimization of in situ substrate surface treatment in a cathodic arc plasma: A study by TEM and plasma diagnostics," J. Vac. Sci. Technol. A 19(4) (Jul.-Aug. 2001), American Vacuum Society, 2001, pp. 1415-1420.

Münz, W.-D. et al., "A new concept for physical vapor deposition coating combining the methods of arc evaporation and unbalanced-magnetron sputtering," Surface and Coatings Technology, 49 (1991), Elsevier Sequoia, Lausanne, 1991, pp. 161-167.

Münz, W.-D., "HIPIMS: Die neue PVD-Technologie," Vakuum in Forschung and Praxis (VIP) 19 (2007), R&D, Wiley InterScience, pp. 12-17.

Ehiasarian, A.P. et al., "CrN Deposition by Reactive High-Power Density Pulsed Magnetron Sputtering," 45th Annual Technical Conference Proceedings (2002) ISSN 0737-5921, Society of Vacuum Coaters, pp. 328-334.

* cited by examiner

Table 1

| Target | Gas | Gas flow [sccm] | Average arc current [A] | Current in pulse [A] | Current pulse length [ms] | Current in pause [A] | Pause length [ms] | Current variation [A] | Average ion current at substrate [A] | Peak ion current at substrate [A] |
|---|---|---|---|---|---|---|---|---|---|---|
| Cr | Ar | 300 | 140 | DC | -- | -- | -- | | 4.5 | -- |
| Cr | Ar | 300 | 140 | 400 | 0.3 | 50 | 1.2 | 350 | 6.5 | 25.3 |
| Cr | Ar | 300 | 140 | 600 | 0.5 | 50 | 3.4 | 550 | 7.8 | 57.8 |
| Cr | Ar | 300 | 140 | 300 | 0.3 | 100 | 1.7 | 200 | 4.9 | 13.8 |
| Cr | O2 | 250 | 140 | DC | -- | -- | -- | | 1.7 | -- |
| Cr | O2 | 250 | 140 | 400 | 0.3 | 50 | 1.2 | 350 | 2.7 | 20 |
| Cr | O2 | 250 | 140 | 600 | 0.5 | 50 | 3.4 | 550 | 3.5 | 58 |
| Cr | O2 | 250 | 140 | 300 | 0.3 | 100 | 1.7 | 200 | 1.7 | 10 |

Fig. 8

Table 2

| Target | Gas | Gas flow | Current in pause [A] | Current in pulse [A] | Peak ion current at substrate [A] | Slope of current rise [A/ms] |
|---|---|---|---|---|---|---|
| Cr | Ar | 300 | 70 | 500 | 40 | 1000 |
| Cr | Ar | 300 | 70 | 500 | 35 | 500 |
| Cr | Ar | 300 | 70 | 250 | 11 | 1000 |
| Cr | Ar | 300 | 70 | 250 | 10 | 750 |
| Cr | Ar | 300 | 70 | 250 | 10 | 500 |
| Cr | Ar | 300 | 70 | 250 | 10 | 250 |

Fig. 9

Table 3

| Experiment | Target | Arc current [A] | Arc operation type | Magnetic system | N2 reactive gas pressure [Pa] | Substrate voltage [V] | Average ion current at substrate [A] | Vaporization rate [mg/min] |
|---|---|---|---|---|---|---|---|---|
| 1A | TiAl | 200 | DC | MAG A | 3.5 | 40 | 6.5 | 78 |
| 1B | TiAl | 200 | Pulse | MAG A | 3.5 | 40 | 17.0 | 153 |
| 2A | TiAl | 300 | DC | MAG B | 9.0 | 40 | 8.7 | 212 |
| 2B | TiAl | 300 | Pulse | MAG B | 9.0 | 40 | 12.0 | 219 |
| 3A | TiAl | 300 | DC | MAG B | 3.5 | 40 | 19.0 | 309 |
| 3B | TiAl | 300 | Pulse | MAG B | 3.5 | 40 | 25.0 | 310 |

Fig. 10

METHOD FOR PRETREATING SUBSTRATES FOR PVD METHODS

FIELD OF THE INVENTION

The invention relates to a method for pretreating substrates of the type that can be performed in the usual way before the layer deposition on substrates by means of PVD methods.

BACKGROUND OF THE INVENTION

Cathodic arc deposition is a method that has been established for years, which is used for layer deposition on tools and parts and is used to deposit a wide variety of metallic layers as well as metal nitrides, metal carbides, and metal carbon nitrides. In this method, the targets are cathodes of an arc discharging process that is operated at low voltages and high currents and with which the target (cathode) material is vaporized. DC power supplies are used as the simplest and cheapest power supplies for operating arc discharging processes.

It is known that the material vaporized by cathodic arc discharging contains a high percentage of ions. Johnson, "P.C. in Physics of Thin Films," vol. 14, Academic Press, 1989, pp. 129-199, describes values of between 30% and 100% for these ions, depending on the cathode material and magnitude of the discharge current. This high percentage of ionized vapor is desirable in layer synthesis.

The high degree of ionization turns out to be particularly advantageous in layer synthesis when it is coupled with a negative bias on the substrate and therefore permits one to increase and vary the acceleration and energy of the ions toward the substrate. The layers synthesized in this way have a higher density and it is possible to influence some layer properties such as the stress of the layer and the layer morphology by changing the bias voltage.

Arc vaporization, however, is also known for the fact that depending on the melting point of the vaporized material, it produces more or less droplets, which are basically not desirable. This percentage of droplets is not usually taken into consideration when indicating the degree of ionization of the vaporized material, but can have a considerable influence on the layer quality. It is therefore desirable to reduce the percentage of droplets in the vaporized material by means of a special source magnetic field or additional filters (mechanical and electromagnetic as described in Aksenov, I. I. et al., Soy. J. Plasma Phys. 4(4) (1978) 425) or to reduce the percentage of them by means of other process parameters such as an increased relative gas pressure. Also, the use of higher-melting materials is proposed in order to reduce the number and size of droplets.

The ionized portion of the vaporized material that is observed in arc vaporization can also be used for pretreating substrates. By successively increasing the substrate bias voltage, its bombardment with the vapor ions of the vaporized material and the working gas can be driven to an extent that permits the substrates to be sputtered and/or heated to high temperatures.

Usually, this process step is referred to as metal ion etching, a somewhat imprecise name, since it does not conceptually include the ions produced by the customary or necessary use of a working gas or reactive gas. Generally, however, it is desirable to reduce the percentage of working gas ions (frequently an inert gas such as argon is used) or to eliminate the working gas entirely. One reason for this is that inert gases cannot be incorporated into layers in a stable fashion since they do not bond and furthermore, result in stresses. In general, however, a continuous operation of the arc source without a gas supply (working gas or reactive gas) is not easily possible. If arc sources must be operated without a working gas, for example the ion sources for ion implantation, then they are operated in pulsed fashion, i.e. the source must be continually reignited since the arc only "lives" for a short time if no gas is added. An example of such a method is described in JP 01042574.

A pretreatment of substrates by means of ion bombardment and the associated etching of the substrate by means of ions as well as the heating of the substrate have already been described in U.S. Pat. No. 4,734,178.

It is important to add here that etching by means of metal ions can lead to treatment results on the substrate surface that differ from those achieved with a simple heating of the substrate or also with a heating of the substrate by means of electron bombardment as described, for example, by Sablev in U.S. Ser. No. 05/503,725. Even the mere use of metal ions yields new reaction possibilities by comparison with inert gas ions, for example the formation of carbides or mixed crystals.

Combinations of implantation and diffusion processes are described in the literature, which result in an integration of the metal ions into the substrate surface and therefore a favorable coupling of the subsequently vapor-deposited layer (Muenz, W.-D. et al., Surf. Coat. Technol. 49 (1991) 161, Schonjahn, C. et al., J. Vac. Sci. Technol. A19(4) (2001) 1415).

The problem with this process step, however, is primarily the existence of metallic droplets whose mass is a multiple of the atomic mass and which usually cannot be removed again by means of an etching step if they come into contact with the substrate surface and condense there.

One way to circumvent this situation is to equip the arc sources with filters that separate the droplets from the ions. A known filter design is based on the work of Aksenov, I. I. et al., Soy. J. Plasma Phys. 4(4) (1978) 425; the arc source is connected to the deposition chamber via a tube that encloses a magnetic field and has a 90° bend. The magnetic field guides the electrons along a curved path and these in turn force the ions, by means of electrical forces, to follow a similar curved path. The uncharged droplets, however, collide with the inner wall of the tube and are thus prevented from reaching the substrate. The resulting reduction in the rate plays a subordinate role for purposes of metal ion etching. It is very disadvantageous, however, that the usable diameter of the ion beam exiting the tube into the deposition chamber has a diameter of only a few centimeters to approximately 10 cm. For many applications, this makes it necessary to move the substrate in front of the source in order to assure sufficient uniformity of the etching process. This excludes these methods from being used for normal batch deposition systems of the type conventionally used for production.

A significantly simpler approach is to work with a baffle plate in front of the arc source and with an offset-positioned anode situated approximately behind the substrate (for example the use of another source as an anode on the opposite side of the chamber) as already been basically outlined in principle in Sablev U.S. Ser. No. 05/503,725, but not described specifically for the MIE process (MIE=metal ion etching). The path of the electrons then passes through the chamber and is forced past the substrates. The electrical fields also force the ions to follow the paths close to the electrons and are thus available for the etching process in the vicinity of the substrate. The droplets are predominantly captured at the baffle plate. This process guidance would be very ineffective for a deposition process because ionized material is also lost at the baffle plate and in the edge regions. However, since in the prior art, the typical processes for metal ion etching require only low currents of a few amperes and etching takes place for only a few minutes, such an operation can in fact be justified for use in production processes. Such an operation, however, which forces the ions onto the electron paths through the substrate holder, requires an anode that is separate from the chamber potential. This requires additional space in the chamber, which in turn reduces the productivity of the system. The above-cited intermittent use of another arc source as an anode has the disadvantage that this source becomes clogged and only becomes usable again if it is cleaned by means of an undesirable "free arcing."

In summary, it would be desirable in MIE if it were possible to eliminate a baffle plate and it were no longer necessary to operate the arc source by means of a separate anode, but instead, the arc sources could be operated with the substrate chamber functioning as an anode (ground) without producing an excessive amount of droplets, primarily ones of large diameter. In addition, it would be desirable to arrive at zero layer growth on the substrate already at a moderate substrate bias (less than 1500 V, preferably less than 800 V) and to have the possibility, by changing the substrate bias, of shifting from the layer deposition phase into the etching phase and vice versa.

Due to the formation of droplets in the arc method, attempts have been made to produce the ions not by means of an arc source, but by means of a sputter source, as described in EP 01260603. It is known that far fewer droplets are produced with the sputtering process. However, it is also known that conventional sputter sources produce much fewer ions. It has been successfully demonstrated, however, that operating sputter sources by means of pulsed power supplies significantly increases the ion density during the pulse. This "High Power Pulsed Magnetron Sputter Method" (HIPIMS) Ehiasarian, A. P. et al., 45th Annual Technical Conference Proceedings, Society of Vacuum Coaters (2002) 328 appears to be well suited for producing significantly more ions than are produced in normal sputtering methods, primarily even metallic ions as well.

A disadvantage of this method, however, is the fact that a significantly more powerful magnetic field in the target is required in order to ignite a magnetron discharge. This more powerful magnetic field, however, disadvantageously results in the capture of the ions produced in the high-energy pulse so that and only a small portion of them reaches the substrate.

A much greater disadvantage of this method, however, is the incompatibility of the HIPIMS-MIE method with PVD deposition in the sense that most of the time, these sources cannot be used for the actual deposition.

The deposition rates with the HIPIMS method are so low that in most cases, additional sources must be used for a layer deposition and it is not possible to use the HIPIMS sources for a layer deposition. This is inconsistent with increasing the productivity of the production systems. And finally, the sputter method likewise requires an inert gas such as argon as a working gas.

The disadvantages of the previously used metal ion etching methods based on cathodic arc vaporization can be summarized as follows:

1. Depending on the target material, the unfiltered arc sources produce a large amount of droplets, some of which have large diameters. These droplets do not have enough energy to permit them to completely react chemically with the components of the substrate surface or to be incorporated into the substrate surface.
2. The reduction of occurrence of droplets through the use of higher-melting target materials increases the material costs and requires greater complexity in the operation of the arcing. The design of the arc sources becomes more complex in order to achieve the higher source currents and discharge voltages required for high-melting materials and the electric supplies likewise become more expensive.
3. Due to the generally greater chemical inertness of higher-melting materials, the desired chemical reactions of these high-melting materials with the components of the substrate surface usually only occur at higher temperatures (for example carbide formation).
4. The combination of the arc sources with electromagnetic and/or mechanical filters for droplet reduction results in a loss in ion current at the substrate. More importantly, the uniformity of such a treatment cannot be guaranteed over large substrate regions of the kind usually encountered in production systems.
5. In addition to the loss in ion current at the substrate, the use of filters also results in a reduction in the percentage of multicharged ions. These increase the probability of chemical (thermally stimulated) reactions since they strike the substrate with a correspondingly multiplied energy and therefore play an essential role in the formation of high-temperature stable bonds. It is in fact conceivable to compensate for the loss of multicharged ions by increasing the substrate bias, but it is generally advisable to avoid voltages greater than 1,000 V, not only to reduce arcing, but also for safety reasons.
6. Higher process gas pressure results in a droplet reduction, but also drastically reduces the substrate current and in turn primarily the percentage of multicharged metal ions. For reasons of process compatibility, it would, however, be desirable to also achieve sufficiently high substrate ion currents for the arc produced in the reactive gas.

The disadvantages of the MIE based on the sputter method by means of HIPIMS can be summarized as follows:

1. No compatibility with arc layer deposition sources because the deposition rates are too low, i.e. it requires special sources and electrical supply for the operation of sputter sources.
2. The substrate ion current is only generated during the pulse.
   A large portion of the ions is captured by the magnetic field of the magnetron and does not reach the substrate, Muenz, W.-D. et al., Vacuum in Research and Practice, 19 (2007) 12.
3. The operation of the sputter sources always requires a working gas that is incorporated into the substrate surface and results in mostly undesirable stress and instabilities in the substrate surface.
4. Working with reactive gas in sputter operation is difficult to control.

Based on the above, the following conclusion can be drawn with regard to a use of MIE:

With the arc sources, the essential issue is the large droplets that cause problems because they do not have enough energy to permit them to diffuse further into the substrate after striking the substrate surface or to undergo chemical reactions with the components of the substrate surface. Otherwise, arc vaporization, with its potential for producing multicharged ions, would be best suited for performing the substrate pretreatment by means of metal ion etching.

Büschel, M. et al., Surf. Coat. Technol. 142-144 (2001) 665 have also disclosed the fact that arc vaporization sources can also be operated in a pulsed fashion in order to deposit layers. In this method, a continuous holding current is overlapped with a pulse current. It should also be noted in this context that the pulsing of the sources leads to a reduction of primarily large droplets in the layer deposition.

It is also known from the literature that pulsing cathodic arc sources without operating them continuously, i.e. continually reigniting them with each pulse, leads to a higher ion current that is primarily due to an increase in the percentage of multicharged ions, Oks, E. M. et al., Rev. Sci. Instrum. 77 (2006) 03B504.

The object of the invention is a zero layer deposition rate despite the fact that the arc deposition sources are operational, i.e. the production of an equilibrium state between material buildup and material removal on/from the surface, and the possibility of controlling this equilibrium state by means of the substrate bias. Another object of the present invention is to create a substrate pretreatment that is based on bombarding the substrate surface with ions, a significant percentage of which are metal ions and reactive gas ions and in the extreme case, it is possible to completely eliminate a working gas.

Another object of this invention is the diffusion of these ions into the substrate surface and a chemical reaction of these ions with components of the substrate surface.

Another object of this invention is the healing of substrate changes that were caused by preceding steps, e.g. cobalt depletion of the substrate surface due to wet chemical substrate cleaning.

SUMMARY OF THE INVENTION

The invention is based on a method for surface treatment of work pieces in a vacuum treatment system having a first electrode embodied as a target, which is part of an arc vaporization source; by means of the first electrode, an arc is operated with an arc current that vaporizes material from the target, which is deposited at least partially and intermittently onto the work pieces, and having a second electrode that is embodied as a work piece holder and, together with the work pieces, constitutes a bias electrode; by means of a voltage supply, a bias voltage is applied to the bias electrode in such a way that the bias voltage is matched to the arc current so that essentially no net material buildup on the surface occurs.

The method according to the invention is then characterized in that the first electrode is operated with a pulsed current; the pulsing leads to an increased substrate current through the work piece surface as compared to non-pulsed operation and as a result, even with a lower bias voltage in comparison to non-pulsed operation of the first electrode, no net material buildup on the surface occurs.

Using pulsed current to operate vacuum deposition systems with arc sources is known. For example, WO2006099760 and WO2007131944 describe the operation of the arc source with pulsed current as an essential factor for keeping the cathode surface free of impermeable oxide layers and guaranteeing a stable arc discharge.

The pulsing of the arc current, which requires special power supplies, continuously deflects the arc along new paths over the target and prevents it from only moving in preferred areas and allowing the remaining target regions to become coated with thick oxide, as is the case with the "steered arc" method.

The pulsing of the current of the arc source thus partially yields a result similar to operating the arc source with a magnetic field, namely a deflection of the arc, which prevents it from remaining in one location for too long and prevents excessive melting of the target and therefore an increased formation of droplets. However, compared to operation with a magnetic field, pulsing has the advantage of not always being guided on a path predetermined by the magnetic field, which can result in stability problems particularly when working with reactive gases.

The pulsing operation of the arc sources can take place both in the form of pulsing the current of the individual arc source and in the form of "dual pulsing" between two arc sources. While the first operation type requires an electrical supply that is only slightly modified (if at all) as compared to the normal DC supply and is therefore inexpensive, the "dual pulsing" requires among other things an additional electrical supply that is connected between two sources, as can be inferred from WO2007131944. But this operation type permits significantly higher frequencies in the pulsing operation, which can be used to achieve steeper current rises.

By means of the invention it is possible, among other things, to heal damages to the substrate caused by the wet cleaning of the substrate (ex situ). This relates in particular to cobalt depletion of the substrate surface.

The invention also relates to the changing of the substrate surface through the incorporation or chemical reaction of atoms from the vapor phase with atoms/components in the outermost substrate surface with the goal of producing a stable bond that assures much better chemical, thermal, and mechanical stability.

The invention also relates to the formation of a thin intermediate layer in the substrate surface, which produces an intimate connection between the substrate and the layer to be applied and performs additional functions as a diffusion barrier layer or chemical barrier layer.

The invention can also be used between layers with differing properties that cannot be produced—or can only be produced to an insufficient degree—by means of a gradient transition and for which an interface is desired, which is as thin as possible and has extremely good adhesion, e.g. between such different materials as oxides, carbides, nitrides, and metallic layers.

This new method is particularly advantageous in applications in which oxide layers are to be joined to metallic layers, metal carbides, metal nitrides, or metal carbon nitrides. In other words, this method is primarily used in applications in which layers with very different properties are to be intimately connected, for example with the direct deposition of oxide layers on hard metal or in the transition from oxides to nitrides in multilayer systems.

The new method is also advantageously used in applications in which layers of different crystalline phases are to be joined to each other with good adhesion.

The primary goal of this invention is to produce stable connections in the outermost substrate surface, between the ions striking the surface and the components of the substrate surface, primarily for those components of the substrate surface that inherently are mechanically or chemically unstable and lead to adhesion problems for the layer that is to be subsequently applied.

This means that the invention describes neither a conventional etching nor a layer deposition, but rather an equilibrium between these processes and that the treatment is performed with the goal of triggering chemical reactions exclusively on and/or in the immediate vicinity of the substrate surface and that the pretreatment is to be completed with more or less zero layer growth or with only a slight growth.

The much greater mass of the ion in comparison to the electron, in connection with the ion energy that can be adjusted by means of the substrate bias permits a chemical reaction between the striking ion and the substrate component, which in the equilibrium state could only be achieved at much higher substrate temperatures. This is even more true of multicharged ions.

According to the invention, an economical solution is achieved that can be used in production systems based on arc vaporization sources.

The invention makes it possible to reduce the occurrence of primarily macroscopic droplets during operation of arc sources. In this connection, the method according to the invention has a wide, easily controllable processing window.

The invention will be explained by way of example in conjunction with the drawings.

BRIEF DESCRIPTION OF THE DRAWINGS

FIG. 8: is a measurement table for pulsed arc current.

FIG. 9: is a measurement table for pulsed arc current.

FIG. 10: is a table depicting the average ion current and the vaporization rate.

DETAILED DESCRIPTION OF THE PREFERRED EMBODIMENTS

Figure 1:
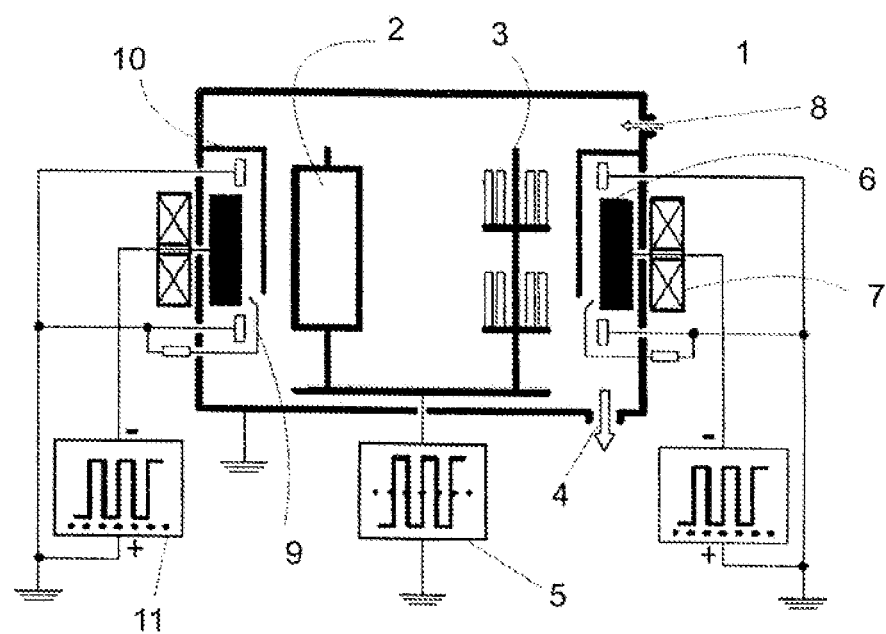
FIG. 1: shows a PVD deposition system with respective, intrinsically pulsed arc sources.

To clearly depict the invention, it is advantageous to first consider the operating mode in which each arc source is pulsed separately and which is depicted in FIG. 1. FIG. 1 shows a PVD layer deposition system (1, batch system) of the kind used for layer deposition through the use of arc sources. The layer deposition system 1 is connected to a pumping station 4 (not shown), which produces the process-related vacuum in the system. The substrate holders 2 and 3 are used to pick up the substrates (tools or parts or other components) and hold them during the pretreatment and layer deposition. The substrate holders and thus the substrates themselves can have a voltage applied to them by means of a substrate bias voltage supply 5 during the pretreatment and the layer deposition so that they are subject to either an ion bombardment (negative voltage) or electronic bombardment (positive voltage). The substrate bias voltage supply can be a DC, AC, bipolar, or unipolar substrate voltage supply. The layer deposition is carried out by means of arc sources. These arc sources include a target 6 whose material is vaporized of the arcs. The source magnetic field produced by the magnets 7 determines whether an arc is guided along a particular path (so-called "steered arc") for example in order to reduce the production of droplets or whether the arc is able to move more or less freely on the target surface (so-called "random arc"), which most often ends up making better use of the target and yields a higher vaporization rate. The operation of the arc can take place in a working gas, which is usually an inert gas. Usually, argon is used for this purpose. Operation can also be carried out, however, with a mixture of working gas and a reactive gas or in only the reactive gas. The reactive gas reacts with the target material vaporized by the arc, thus forming the corresponding nitrides, oxides, carbides, and mixtures thereof. The gases can be admitted either through a shared gas inlet 8 or through various gas inlets distributed throughout the system and the process pressure and gas composition in the treatment chamber can be controlled by means of gas flow meters. Either an ignition probe 9 or another electrical ignition device can be used to ignite the arc on the target. The baffle plate 10 can be used to close off the target so that despite the arc vaporization, no vaporized target material reaches the substrate. The arc current for the arc vaporization is supplied by the power supply 11. Usually, the power supply is a conventional DC power supply. The experiments here used a pulsed power supply of the kind commonly also used in pulse welding. It is thus possible to overlap a constant DC current with an additional pulse current. It is significant here that between the pauses, the current does not completely return to zero, but instead remains at a level (pause current) that does not allow the arc to die.

In order to be able to more thoroughly investigate the effect of the arc current pulsation on the substrate ion current, only one source was used in these experiments. Without being limited to this material, first a Cr target was selected for the arc vaporization. The Cr target was operated on in argon as the working gas, with an argon gas flow of 300 sccm and with a DC source current of 140 A. The current rise times were kept constant by selecting a setting of 1,000 A/ms at the power supply. In all of the following experiments, the substrate ion current was measured for a typical, unmodified substrate holder, i.e. as a total. It should be added here that a small error in the measurement of the total (integral) current can occur, which results in the fact that not all ions are captured at the substrate holders and can also for example strike the chamber wall. But for comparative measurements and a dense substrate packing, this error can be taken into account because it is assumed not to distort the general trend of the measurements, which should be understood here to be only relative information. Through the use of a DC source current, an average ion current at the substrate of 4.5 A was measured (see Table 1). By contrast, in the case of a pulsed source current with 600 A in the pulse and a pulse length of 0.5 ms and with 50 A in the pulse pause and a pause length of 3.4 ms, an average substrate ion current of 7.8 A was measured. And this was the case even though the arc current averaged over time was likewise 140 A. The ion current peak at the substrate in this case was actually 57.8 A.

The following trends can be ascertained from Table 1 (FIG. 8):

The pulsing of the arc current leads to an increase in the substrate current.

The greater the difference between the pulse current and the pause current, the greater the substrate current, both during the pulse and averaged over time.

The influence of the pulsation of the arc current on the substrate current was also investigated for operation of the arc sources in pure reactive gas, in this case in oxygen. As a comparison, the arc sources were once again operated with DC voltage and Cr targets and an oxygen flow of 250 sccm were used. This yielded an average substrate ion current of 1.7 A (likewise in Table 1). By contrast, in the case of a pulsed source current with 600 A in the pulse and a pulse length of 0.5 ms and with 50 A in the pulse pause and a pause length of 3.4 ms, an average substrate ion current of 3.5 A was measured. Once again, the average arc currents for DC and pulses were the same, namely 140 A. The ion current peak at the substrate in this case was 58 A. The same trends that occurred with the operation in argon are once again discernible with the operation in the reactive gas. It is also evident that with the operation in pure oxygen, the substrate current drops in comparison to the operation in argon. A pulsation of the arc sources can at least partially compensate for this and consequently permits a high substrate current to be achieved, even when working in pure reactive gas, i.e. omitting the working (inert) gas, which is in fact advantageous for the pretreatment in question here.

Figure 2A:
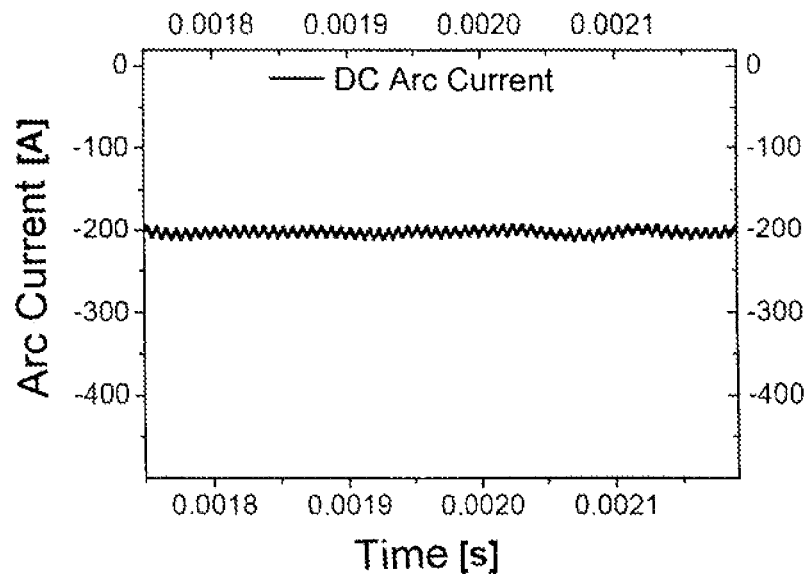
FIG. 2a: shows the DC arc current.
Figure 2B:
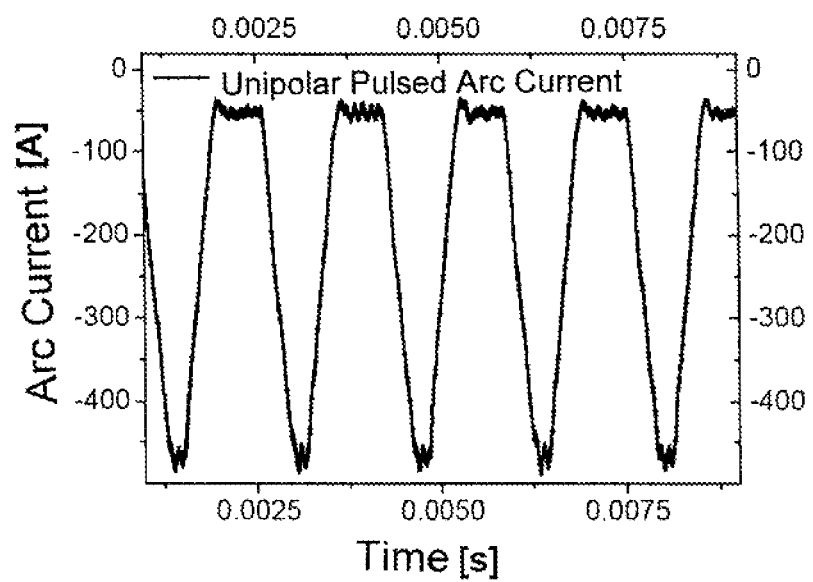
FIG. 2b: shows the pulsed arc current.

In order to demonstrate that this behavior applies not only to single-element targets, but also to alloy targets, further tests were carried out with Al—Cr targets, in this case for example a target composed of Al/Cr with a composition of 70 at %/30 at %. Once again, DC arc operation was compared to pulsed arc operation. The work was carried out with an average arc current of 200 A in a pure oxygen atmosphere with an oxygen flow set to 400 sccm. As a comparison, the arc current was then pulsed between 50 A in the pause and approx. 470 A in the pulse. This pulse current once again yields an average of 200 A over time, i.e. is comparable to the DC arc current. FIGS. 2a and 2b show the chronological sequences of these two currents; in this case, the arc current was arbitrarily plotted as negative. FIG. 2a shows the DC arc current and FIG. 2b shows the pulsed arc current.

Figure 3A:
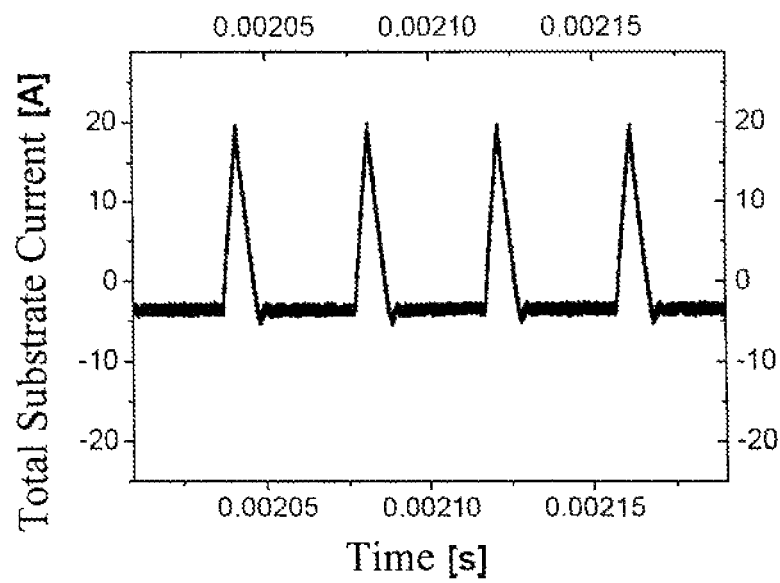
FIG. 3a: shows a substrate current for the case in which DC arc current was used.
Figure 3B:
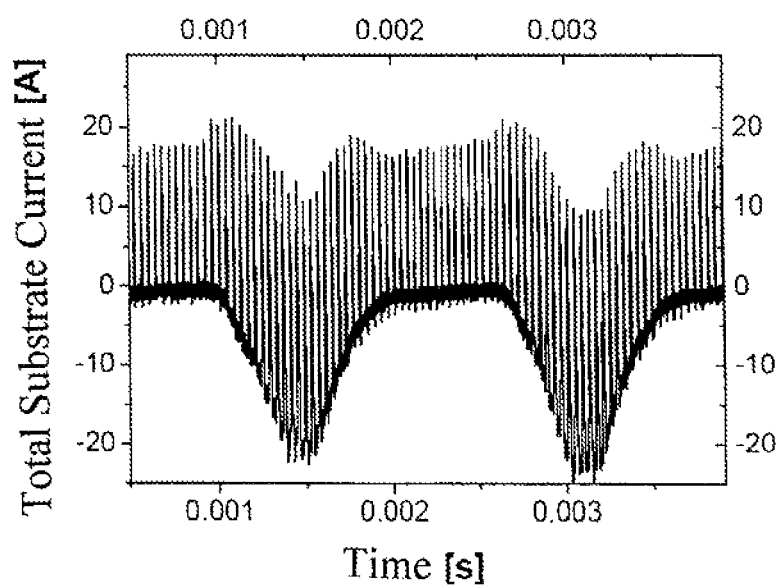
FIG. 3b: shows the substrate current for the case in which the pulsed arc current was used.

The total substrate ion currents measured for this operation are depicted in FIGS. 3a and 3b; in this case, the ion current portion of the substrate current was depicted as negative while the electron current was depicted as positive. FIG. 3a shows the substrate current for the case in which DC arc current was used and FIG. 3b shows the substrate current for the case in which AC arc current was used.

Since the use of an Al/Cr target in an oxygen atmosphere results in the formation of oxide layers, work on the substrate was carried out with a bipolar substrate bias (approx. 25 kHz). During DC operation, the ion flow (depicted as negative) can be clearly discerned from the electron current (positive axis). Integrating over the substrate ion current (i.e. over the negatively depicted current) yields an average of 2.8 A over time. For the operation with pulsed arc current, the overlapping of the arc current frequency (approx. 700 Hz) with the pulse frequency of the substrate bias is reflected in the current curve of the substrate current. If an average is taken here likewise over the substrate ion current (negative value range), then this yields an average ion current of 4.9 A, i.e. the substrate ion current can be almost doubled through pulsation of the arc source.

In the example given, an operation of source supply and substrate bias supply is described in which the two supplies are not synchronized. At approx. 25 kHz, the frequency of the substrate bias supply is significantly higher than that of the source current supply (approx. 700 Hz). Reasonable pulse frequencies of the source current supply lie between 1 Hz and 5 kHz. Preferably, pulse frequencies of between 500 Hz and 2 kHz are used. This overlap is also seen in the substrate current during the pulsing of the source current. The bipolar-pulsed bias slightly reduces the total substrate current as compared to PC bias.

A drastic increase in the substrate current in the pulse peak (but not in the average over time) is obtained if the two supplies are synchronized. In other words, for the frequency of the bias voltage, a frequency that corresponds to the source current or an integral multiple thereof is selected. In the negative peak, the bias voltage should, however, be time-shifted relative to the peak of the source current so that the flight time of the ions from the target to the substrate is taken into account. This operation is advantageous for MIE since it requires achievement of brief ion bombardment with very high energies. This does, however, entail some additional effort for the synchronization of the supplies, primarily for operation in batch systems with different batch loads. For this reason, a synchronization is generally omitted as long as this does not result in any perceptible disadvantages in the process.

In summary, the result is that it is significantly easier in the pulsed operation of the arc sources to drastically increase the removal rate with approximately the same vaporization power, as defined by the average current, and thus to shift into the zero layer growth range.

In light of the above, it is also clear that in the zero layer thickness growth range, with the setting of the duty cycle of the bipolar substrate bias supply, there is an additional parameter available for shifting out of the etching range and into the layer-depositing range, in fact while maintaining the same substrate voltage. In the method according to the invention, the substrate bias can be operated as a DC voltage. An AC operation does in fact reduce the substrate current slightly as a rule, but this can be used to effectively prevent the undesirable drawing of arcs from the substrate. In particular, low duty cycles facilitate the prevention of such undesirable arcing.

Up to this point, it has been demonstrated that for single-element targets and alloy targets, pulsed operation of the arc sources in inert gas results in a substrate ion current increase similar to the one resulting from operation in oxygen. The operation of arc sources in a pure nitrogen reactive gas should be investigated further in another experiment below. The experiments associated with this are summarized in Table 3. First, for an arc current of 200 A, DC operation was compared with pulsed operation. The Ti/Al targets used in the example (without limitation to the target material and its composition) have a composition of 50 at %/50 at % Ti/Al. The nitrogen flow was regulated during arc vaporization so that a process pressure of 3.5 Pa was produced in the deposition chamber. For the DC operation, this resulted in a substrate current of 6.5 A. In the case of the pulsed operation, for the same average arc current of 200 A, it was possible to achieve a substrate ion current of 17 A. These tests were carried out with a target magnetic field (MAG A) that is strong enough to guide the arcs along predetermined paths to force the production of a so-called "steered arc." The person skilled in the art is aware that an operation of this kind results in a drastic reduction in the formation of droplets because the arcs remain in a location for a shorter time so that the melting in the arcing region can be kept to a minimum. In this example, it is once again clear that with pulsed operation, it is possible to increase the substrate ion current and to use it to achieve a zero layer thickness growth even at moderate substrate bias voltages.

The same targets were used at a higher arc current to carry out processes for investigating the influence of the reactive gas pressure on the substrate ion current. A weak target magnetic field (MAG B) was used for this, which does not force the arcs along a particular target path (random arc). For the operation at a nitrogen pressure of 9 Pa, it was possible to increase the substrate ion current from 8.7 A to 12 A. At a pressure of 3.5 Pa, the substrate current was increased from 19 A to 25 A. Once again, this clearly demonstrates the positive influence of pulsed arc current on an increase of the substrate ion current.

Reexamining the goal of the method once again in the context of the results in Table 3 (FIG. 10) yields the following conclusion:

Even in the reactive gas nitrogen, the pulsed operation of the arc sources results in an increase of the substrate ion current.

The increase of the substrate current is much more pronounced in the case of the steered arc as compared to the random arc.

For steered arcs, the pulsation increases both the vaporization rate and the substrate ion current, but the increase of the substrate ion current is relatively greater.

For random arcs, there is only to an insignificant change in vaporization rate, but the substrate ion current increases considerably.

In summary, it is possible here as well to state that pulsed operation contributes to the achievement of zero layer growth even at a low substrate bias because it is possible to increase the substrate ion current.

The results from Table 1 suggest that the slope of the current rise in the pulsed operation could also have an influence on the substrate current. Investigations were therefore carried out and the results of these investigations are given in Table 2. The tests always started with the same arc current during the pause (70 A) and then jumped to the pulse current. Different slopes for the jump were set in the power supply. The substrate peak ion current was measured as a function of the different slopes of the pulse and as a function of the pulse current. Comparing rows 1 and 2 of the table clearly reveals that a greater slope in the pulse results in an increase in the substrate peak ion current from 35 A to 40 A. Table 2 also shows that starting at approximately 1,000 A/ms, the slope of the current rise results in a significant increase in the substrate ion current. Shorter rise times of between 250 A/ms and 750 A/ms have hardly any influence.

Based on this result, it is understandable that an increase in the current rise times can have a significant influence on an increase in the substrate current. Technologically, however, this is difficult if this must be implemented by means of power supplies that are used as pulsed power supplies of the kind shown in FIG. 1. In the power supplies that are commercially available today, an increase in the current rise times to approximately 50,000 A/ms, i.e. by a factor of 50 times the maximum value given in Table 2 (FIG. 9), would require a large technical and financial investment and would generally be difficult to achieve. In addition, at these current rise times, the cable impedances of the power cables play a significant role and influence the pulse shape, i.e. reduce the slope.

Figure 4:
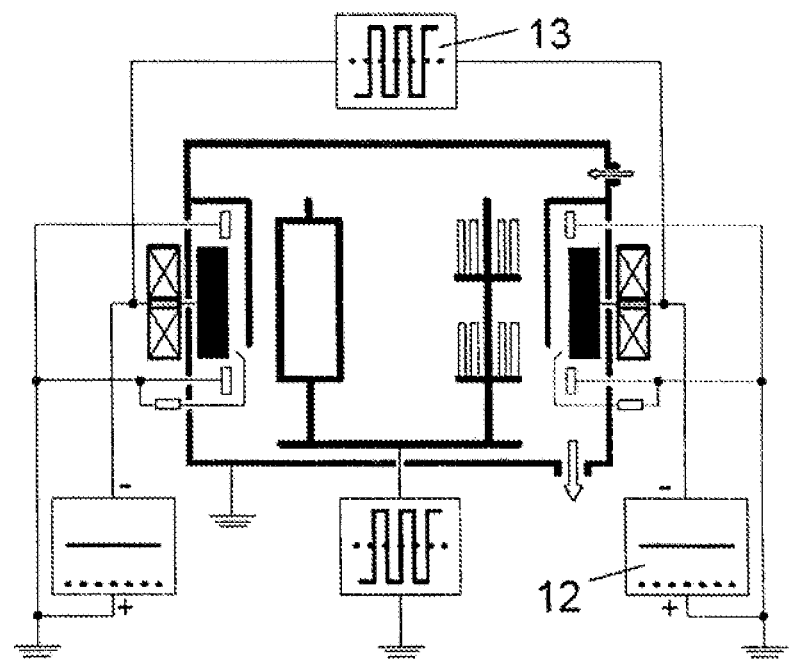
FIG. 4: shows a PVD deposition system for the dual-pulse method.

FIG. 4 shows a process approach ("dual pulse method") that is suitable for implementing very high pulse frequencies even for high currents. In this approach, a bipolar voltage or power supply (13, not to be confused with the bipolar substrate bias supply!) is operated between two arc sources, which are additionally each powered by the customary DC power supply (12). The advantage of such an arrangement lies in the fact that the bipolar supply is operated in the preionized plasma of the two arc vaporization sources. This enables a very rapid pulsing of the plasma with frequencies in the range of several hundred kilohertz and permits currents that essentially correspond in magnitude to the currents of the source power supplies. The magnitude of the bipolar current of the supply 13 only has to be adapted so that the resulting total current through the arc source is not below the holding current, i.e. the arc does not die, but can be operated continuously.

Figure 5A:
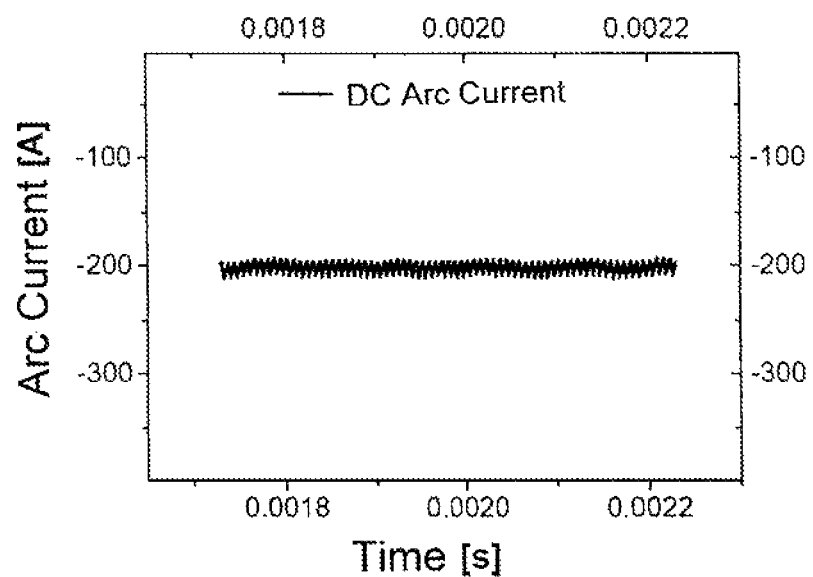
FIG. 5a: shows the arc current that flows through an arc source during DC operation.
Figure 5B:
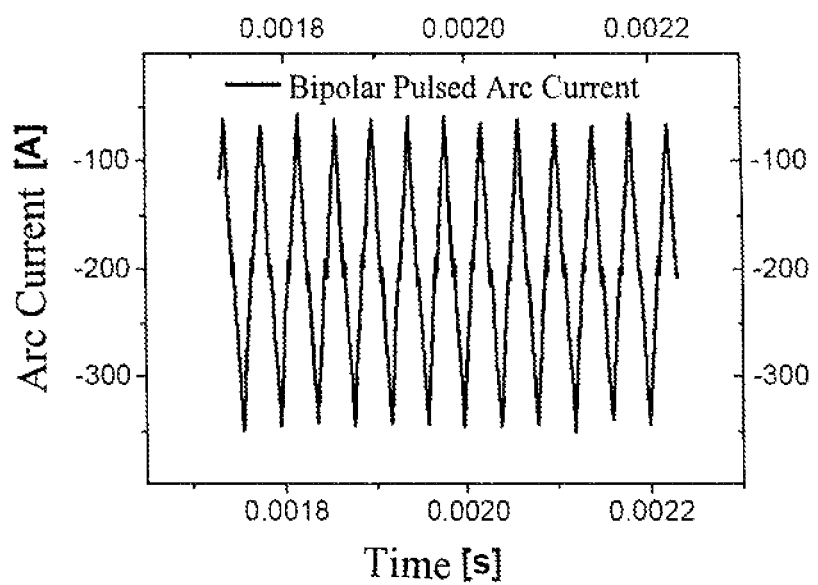
FIG. 5b: shows the arc current when the arc source is overlapped with bipolar pulses.

The example in FIG. 5*a* once again depicts the arc current that flows through an arc source in DC operation. Operation was once again carried out with 200 A in pure oxygen reactive gas, once again using targets composed of Al/Cr in a ratio of 70 at %/30 at %. FIG. 5*b* shows the arc current when the arc source is overlapped with bipolar pulses; the arc clearly current pulses between 50 A and 350 A with a frequency of 25 kHz. This corresponds to a current of 200 A averaged over time. Once again, the corresponding substrate ion current with DC arc operation (FIG. 6*a*) was compared to that of bipolar operation (FIG. 6*b*). The current rise speeds here are dictated by frequency and at this frequency are on the order of $10^6$ A/s. This current rise speed can, however, easily be further increased by increasing the frequency to 100 kHz or 500 kHz.

Figure 6A:
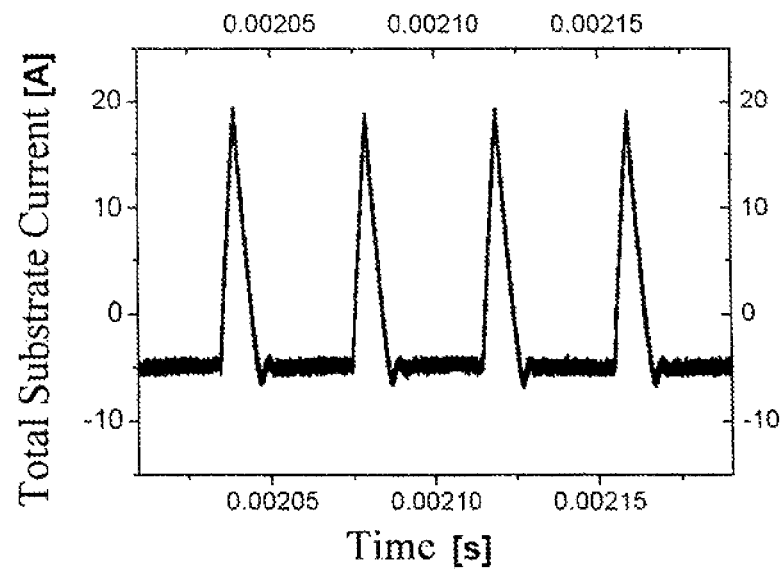
FIG. 6a: shows the substrate ion current during DC arc operation.
Figure 6B:
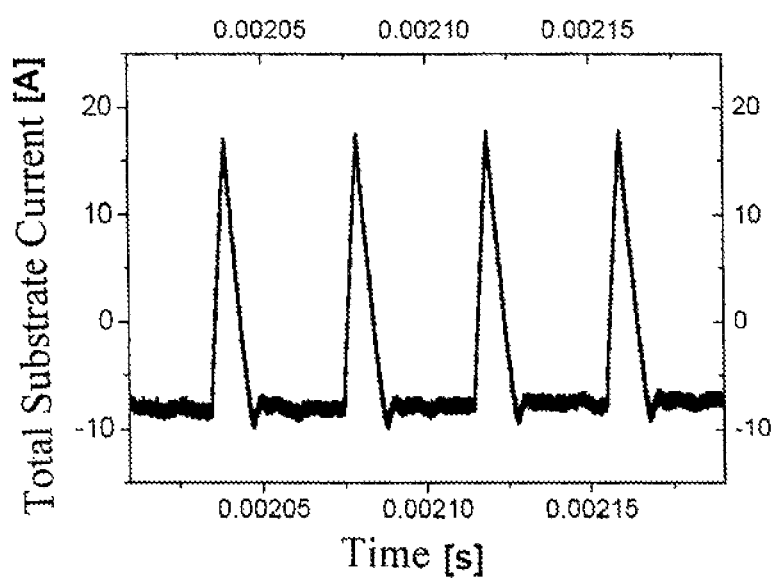
FIG. 6b: shows the substrate ion current during bipolar operation.
Figure 7:
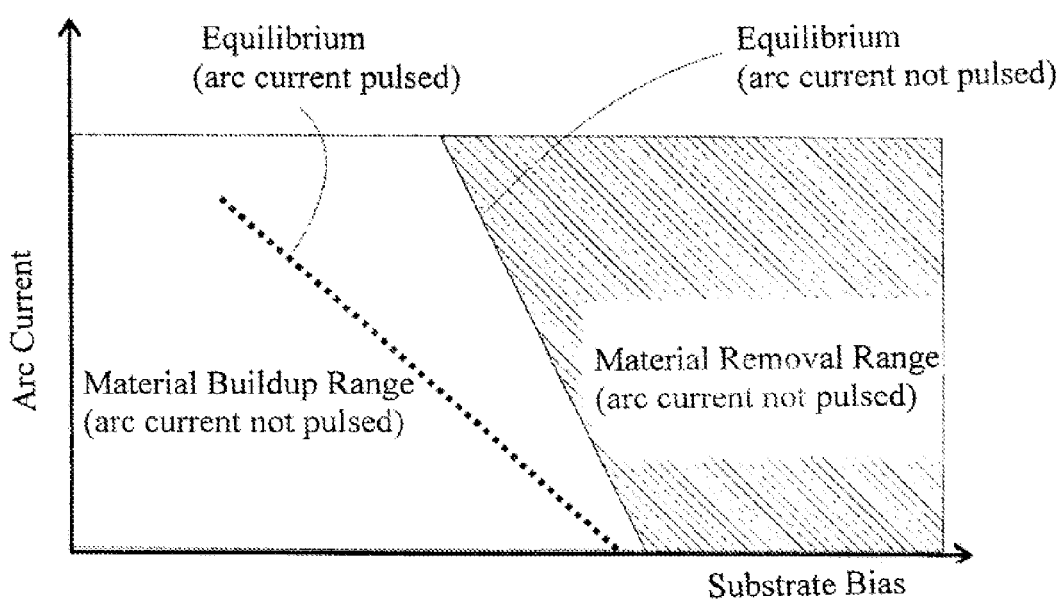
FIG. 7: schematically depicts the relationship between material buildup and material removal depending on the arc current and substrate bias.

The "dual pulsing" of the sources likewise results in a significant increase in the substrate current, as demonstrated by the comparison of FIGS. 6*a* and 6*b*. The average substrate current increases from 3.8 A with DC operation of the arc sources to 6 A with pulsed operation, i.e. by approximately 50%.

It follows from the above description that a substrate ion current increase can occur solely due to the changing of pulse parameters, i.e. can easily be adjusted electrically, and a parameter that requires no change for example to the bias voltage or the source current or the gas pressure can therefore be freely selected. The process approaches are easy to implement with the corresponding power supplies and no additional sources in the system are required; instead, the usual arc sources can be used. It is possible to eliminate the working gas and to carry out the operation in only the reactive gas.

Both operating modes of pulsing the arc sources were then used for pretreating substrates. Since the vaporization rates of the cathode material for both operating modes do not differ significantly from the DC vaporization rates (at least in random arc operation), it can be assumed that they primarily generate multicharged metal ions, which are produced with the pulses of the arc sources, and that this increases the substrate current. This assumption is also corroborated by publications such as Oks, E. M. et al., Rev. Sci. Instrum. 77 (2006) 03B504. However, an additional single ionization, primarily of the reactive gas, also occurs when the arc sources are pulsed.

The increase of the substrate ion current without the occurrence of a significant increase in the vaporization rate permits a better etching efficiency. In other words, with the same bias on the substrate, faster etching can be achieved or with a lower bias, the same etching rate is achieved. In DC operation of the arc sources with a current of 120 A, for example an etching rate of 14 nm/min on substrates with dual rotation is achieved when working with a substrate bias of 800 V. A bias of 300 V under these conditions puts the process approximately in the vicinity of the equilibrium between layer deposition and etching.

If at the same average arc current, the pulse parameters are used to set a 50% increase of the substrate ion current, this increases the etching rate to 23 nm/min at a substrate bias of 800 V or else a substrate bias of approximately 200 V can be used in order to reach equilibrium between layer deposition and etching.

It is also possible to change the duty cycle in the substrate bias supply so that the process operates at 800 V, but only a 50% duty cycle and in this way, the equilibrium between etching and layer deposition is achieved even at higher voltages, i.e. at high ion energies, thus controlling events on the substrate surface that are dependent on the ion energy.

Since it is difficult to mathematically estimate etching rates for production batches, it is advisable to identify the equilibrium between layer deposition and etching for a predetermined vaporizer output. A significant improvement in the adhesion of PVD layers for a substrate pretreatment of 3 minutes has already been achieved. In this connection, the adhesion was measured using the scratch test known to the person skilled in the art (with regard to ISO 1071, ASTM G171).

The pulsing of the sources, however, not only increases the substrate current, it also affects the movement of the cathode spot and with the pulsing, a deflection of the cathode spot occurs. The powerful current changes during the pulsation produce electromagnetic fields that are powerful enough to influence the arc path. A positive aspect of this is mainly a reduction in the number of primarily large metallic droplets, thanks to the shorter amount of time that the arc remains in a particular location.

The increase in the substrate ion current is also advantageous from the standpoint of being able to operate with lower average source currents. The person skilled in the art knows that a reduction of the source current also goes hand-in-hand with a reduction in droplet formation.

WO2006099760 described the pulsing of the source current in order to make it possible to use steered arcs for an oxide deposition procedure. To prevent the arc from only traveling on the steered path and the target surface from becoming completely oxidized outside of this path and thereby leading to instabilities in the arc operation, the arcing was pulsed. The result of this was the prevention of oxidation of the target outside the area for the steered arcs. If the steered arcs are now combined with the pulsing in the same way, it is possible to make the following experimental observation:

The steered arc has a lower vaporization rate of the target material, but a sharply reduced frequency of droplet formation The pulsing of the steered arc does result in an increase in the vaporization rate of the target material, but at a much greater relative increase of the substrate ion current.

In this way, it is possible to implement conditions that are ideal for the pretreatment of substrates and in which the frequency of droplet formation is drastically reduced.

As has already been demonstrated above, cathodic arc vaporization is extremely well suited for reactive processes. By contrast with the sputter method, it is very easy to regulate the reactive gas and it is possible to operate with a surplus of reactive gas without resulting in target contamination. In addition, in reactive gas processes, it is possible to eliminate a working gas such as argon and to operate in pure reactive gas such as nitrogen or oxygen. There is thus no risk of an inert gas being incorporated into the substrate surface. This avoids not only the weakening of the substrate surface due to stress, but also instabilities due to diffusion or incorporation of the inert gas into the layer.

In addition to ionizing the metals, the pulsing of the sources also ionizes the reactive gases and these can likewise be used to "treat" the substrate surface. It should be emphasized here that an etching step is intentionally not mentioned here since, as stated at the beginning, the goal of the pretreatment is neither a significant material removal nor a significant layer growth. The process is set precisely so that a kind of equilibrium between etching and layer deposition is assured and ion bombardment occurs, which introduces as much energy as possible into the substrate surface in order to defuse the metal ions into it, allowing them to be implanted or to react with "unstable" substrate components on the surface.

The process cannot be easily controlled, especially not in batch systems and under production conditions. A change in the batch load in principle results in a new layer depositing/etching ratio. It is also necessary to bear in mind that at sharp edges, substrates have a more powerful electrical field that results in intensified etching. For this reason as well, it is advantageous if the vapor generated by the sources has the highest possible percentage of ions, primarily highly charged ions, so that the sources can be easily operated in the zero layer-depositing range, with the boundary condition that a comparatively low substrate bias is sufficient for this.

Metal ion etching, at least with regard to multicharged ions produced in pulsed operation of the arc sources, has not been sufficiently investigated from a theoretical standpoint to permit the assessment of the sputter effects with the diffusion processes, an implantation into the outermost substrate surface, and the reactions of the primarily multicharged ions on the substrate surfaces against one another. From a strictly empirical standpoint, however, a significantly improved adhesion of PVD layers to metallic substrates can be observed as a result of the process. This applies particularly to HSS and especially to hard metal substrates.

In the adaptation of process parameters for the substrate pretreatment, the first step was therefore always a calibration carried out so that for a certain target material, the source current, the pulse shape of the source current, the source magnetic field, the substrate bias, the working gas pressure, and/or the reactive gas pressure, a process window was established so that for a time between 30 s and 10 min, depending on the batch loading of the system, no layer growth or only a layer growth of less than 20 nm was measured on the substrates. To accomplish this, not only metallic substrates, but also for analysis purposes, silicon wafer samples were treated in the system. In silicon wafers, even slight layer thicknesses can be measured with particular ease using RBS analysis, which is known to the person skilled in the art.

Most of the time, operation was carried out with as low a source current as possible, with as steeply sloped pulses as possible in order to obtain a high yield of multicharged ions. Then, the layers resulting from such an operation of the source(s) were measured for various bias voltages, typically between 40 V and 1,200 V. The resulting dependency was then used to select the process parameters so as to set an approximately zero growth (±5 nm) on the substrate.

In this type of substrate pretreatment, it appears to be important that by means of the high-energy—of primarily multicharged ions—introduced into the substrate surface, there is a possibility of producing chemical reactions with the components of the substrate or triggering diffusion processes in the region of the substrate surface.

It should be mentioned here without limitation that the formation of a carbide with the ions of a target source composed of chromium is of particular importance. In the case of the conventional etching process with argon gas, the aim is to remove material from the substrate surface so that loose particles of the substrate surface, for example the residues of a polishing process, are removed before the actual deposition process is begun. In most cases, this conventional method is retained before the actual substrate pretreatment briefly described above is begun because it is self-evident that the substrate pretreatment only makes sense if the coarsest residues of remaining foreign material have been removed from the substrate surface. In the step of the substrate pretreatment of interest here, naturally sputtering processes also occur if multicharged chromium ions strike the substrate surface. But the multiple energy input of the multicharged ions simultaneously also triggers chemical reactions. However, as mentioned above, removing material is not the goal of the substrate pretreatment in this invention, but rather promoting a chemical reaction. If the chromium ions now have a sufficiently high energy, then for example in a hard metal substrate (thread-cutting insert) that is primarily composed of tungsten carbide and small amounts of elementary tungsten and carbon and typically also contains cobalt as a binder, the formation of chromium carbides and/or mixed crystals of Cr, Co, and W can occur. The higher the percentage of chromium ions, the more probable a carbide formation is. The percentage of multicharged ions makes a large contribution because they do in fact introduce several times the energy and therefore can penetrate into the substrate and react, even with components situated at a somewhat deeper level.

A phase analysis by means of X-TEM established the existence of carbide phases with chromium. While these chromium carbide phases already appeared with a slight increase in substrate current, in the case of titanium, it was necessary to work with higher substrate ion currents and with a higher substrate bias in order to detect any carbide formation.

One additional experimental result should be mentioned that relates to the diffusion processes that are stimulated by the energy input by the ions into the substrate surface. Observations using RBS and SIMS demonstrated that after the substrate pretreatment, a significant diffusion of the cobalt (binder) into the substrate surface occurred. An improvement in linear adhesion and a better performance of the tool were also due to the fact that a hard metal surface that has been cobalt-depleted by a wet cleaning step is "healed" again and regains sufficient strength due to the diffusion of cobalt toward the surface.

It has already been mentioned above that an operation of the arc sources in reactive gas alone is also possible. The operation in reactive gas, primarily at higher pressures, however, can cause the substrate current to decrease. This is due to charge transfer reactions between the multicharged metal (source) ions and the reactive gas atoms. In this case, the pulsed operation of the arc sources offers help from two standpoints. On the one hand, it increases the substrate current because it creates multicharged metal ions and on the other hand, it also increases the chemical reactivity of the reactive gas due to its higher ionization. As a result, not only do chemical reactions with the metal gas ions and components of the substrate surface occur, but also reactions between for example nitrogen and the components of the substrate surface, thus forming nitrides.

Substrate pretreatment with oxygen as a reactive gas has also demonstrated—among other things in non-metallic substrates such as oxide ceramics—significant improvement in layer adhesion, primarily when depositing oxide layers. This process can be further encouraged through the application of an RF substrate bias.

Finally it should also be added that a higher reactive gas pressure further reduces the formation of droplets, but the pulsing of the sources makes it possible to compensate for the loss in substrate current.

The usual wet chemical pretreatments, particularly of hard metal substrates such as thread-cutting inserts or also certain types of HSS, can result in a depletion of the substrate surface with regard to particular material components (for example a depletion of the binder in the hard metal for which cobalt is frequently used). This is particularly critical with thread-cutting inserts in which even the concentration of cobalt toward the substrate surface is increased in order to give the cutting edge greater strength for better support of the subsequently applied hard material layer (TiC, TiCN, Al2O3) (ref U.S. Pat. No. 4,497,874). The inventor was able to discover that the described method according to the invention contributes to the fact that a diffusion of the cobalt toward the substrate surface can be initiated and therefore the damages caused by the wet chemical pretreatment can be largely compensated for. Up to this point, the damaged layer had to be removed by means of a longer etching step in the deposition chamber so that the layer adhesion could be assured. The inventor was also able to determine that this healing process, particularly in the case of cutting edges and especially in thread-cutting inserts, is very effective due to the increased ion bombardment of the cutting edge of the substrate. One possible explanation for this is that the increase in ion bombardment is caused by the field enhancement that occurs when a bias is applied to geometries with a small edge radius. This has been explained here in the example of cobalt diffusion, but essentially also relates to other types of thermally controlled "healing processes" on the substrate surface.

Another advantageous embodiment relates to carbide phases of tungsten. In this connection, it is known from CVD technology that such carbide phases of tungsten (so-called eta phase, ref U.S. Pat. No. 4,830,886) are fragile and are responsible for a poor adhesion of a subsequently applied hard material layer. The inventor has determined that with the aid of the method according to the invention, it is possible to successfully transform unstable carbon compounds and uncombined carbon into stable carbides or mixed crystals by means of the high-energy metal ions used in the method.

The high temperatures that the ion bombardment, primarily also with multicharged ions, generates on the substrate surface, but particularly at the cutting edge of the tool, in addition to triggering the above-mentioned chemical reactions, also promote diffusion processes of both the utilized target material and the substrate material. The inventor has determined that diffusion, for example of Ti, into the outermost layers of the substrate surface that turns out to be advantageous for the adhesion of a hard material layer that likewise contains Ti, e.g. TiN, TiCN, or TiAlN. This diffusion of target atoms into the substrate is particularly advantageous if favorably adhesive transitions to hard material layers with very different physical and mechanical properties are to be implemented, e.g. in a direct depositing of aluminum oxide or aluminum chromium oxide or boron nitride or silicon nitride onto the hard metal. The invention thus provides a very good method for depositing these layers on hard metal.

The inventor has also determined that this diffusion method can also be used at transitions in multilayer systems. In this connection, it is very advantageous that the energy of the incoming ions can be primarily limited to the region of the substrate surface and that a conventional pretreatment step normally lasts only a few minutes, which does in fact lead to high temperatures on the substrate surface and possibly once again especially at the cutting edge, but does not lead to an excessive thermal stressing of the entire substrate.

Since the above-mentioned diffusion processes are triggered by the local temperature increase during ion bombardment, after treatment, the region of the substrate layer transition is thermally stable even in the subsequent cutting applications and at the accompanying increased substrate temperatures, correspondingly reducing the undesired diffusion processes during tool use.

Based on the above-mentioned facts, the method has another advantage that it is possible to use targets composed of materials that are then also used for synthesis of the hard material layer, i.e. the diffusion processes and the chemical reactions are carried out with materials that subsequently return to the layer. With this method, it is thus also possible to use alloy targets and various reactive gases in order to intentionally initiate chemical reactions and diffusion processes.

The pretreatment step can also be used, together with the use of a reactive gas, to transform for example metallic components in the substrate surface into compounds that are high-temperature stable and that exert a desired influence on the nucleation behavior of the layer to be subsequently deposited. The formation of corundum phases on aluminum or chromium should be mentioned as examples of this.

The invention claimed is:

1. A method for coating work pieces in a vacuum treatment system having a first electrode embodied as a target, which is part of an arc vaporization source, comprising:
    using the first electrode, operating an arc at a first arc source in a pulsed fashion with an arc current, and vaporizing material from the target; applying a bias voltage from a first bipolar power supply to a bias electrode, wherein the bias electrode comprises a second electrode that is embodied as a work piece holder, together with the work pieces, and operating a second bipolar power supply between the first arc source and a second arc source, wherein the first and second bipolar power supplies are operated in pre-ionized plasma of the first and second arc sources, respectively, and the bipolar power supply between the first and second arc sources, which are separately operated by respective DC power supplies, is operated in such a manner that a current rise of at least 1,000 A/ms is produced, which results in an increase of a substrate ion current;
    pretreating the work pieces using metal ion bombardment, which includes increasing the substrate ion current without a significant increase of a vaporizing rate by using a bias voltage of not larger than 800 V, and controlling the bias voltage to achieve equilibrium between layer deposition and etching so that neither a significant material removal nor a significant material buildup occurs, but instead, introducing metal ions into a substrate surface, with the introduced metal ions including ions of a metal that is a component of a layer to be applied; and
    directly depositing the layer onto the pretreated substrate surface.

2. The method as recited in claim 1, wherein the layer comprises at least one of the group consisting of a carbide layer, an oxide layer, and a nitride layer.

3. The method as recited in claim 1, wherein the layer has one or more metallic components.

4. The method as recited in claim 3, wherein the layer comprises at least one of the group consisting of Ti, Al, B, Si, TiAl, and AlCr.

5. The method as recited in claim 1, wherein the layer is a layer of titanium nitride, titanium carbon nitride, titanium aluminum nitride, aluminum oxide, aluminum chromium oxide, boron nitride, or silicon nitride.

6. The method as recited in claim 1, wherein the introduced metal ions are a metallic component of the layer to be deposited onto the substrate surface or the metallic component of the next layer of a multilayer system.

7. The method as recited in claim 1, comprising letting reactive gas containing oxygen into the vacuum treatment system during the pretreatment.

8. The method as recited in claim 1, comprising using targets for the pretreatment, wherein the targets are composed of materials that are also used to synthesize an oxide layer.

9. The method as recited in claim 1, comprising using an alloy target for the pretreatment.

10. The method as recited in claim 1, comprising selecting the bias voltage to ensure that the layer has a high density and stress resulting from acceleration of the ions toward the substrate.

11. The method as recited in claim 1, comprising eliminating a working gas and carrying out the method in only a reactive gas.

12. A method for producing a multilayer system on a work piece in a vacuum treatment system having a first electrode embodied as a target, which is part of an arc vaporization source, comprising:
    using the first electrode, operating an arc at a first arc source in a pulsed fashion with an arc current and vaporizing material from the target, and applying a bias voltage from a first bipolar power supply to a bias electrode, wherein the bias electrode comprises a second electrode that is embodied as a work piece holder, together with the work pieces, and operating a second bipolar power supply between the first arc source and a second arc source, wherein the first and second bipolar power supplies are operated in pre-ionized plasma of the first and second arc sources, respectively, and the bipolar power supply between the first and second arc sources, which are separately operated by respective DC power supplies, is operated in such a manner that a current rise of at least 1,000 A/ms is produced, which results in an increase of a substrate ion current;
    carrying out a metal ion bombardment in at least one transition from one layer to an adjacent layer of the multilayer system, which includes increasing the substrate ion current without a significant increase of a vaporizing rate by using a bias voltage of not larger than 800 V, and controlling the bias voltage to achieve equilibrium between layer deposition and etching so that neither a significant material removal nor a significant material buildup occurs, but instead, introducing metal ions into a substrate surface or into a layer of the multilayer system, with the metal ions introduced into the substrate surface or into a layer of the multilayer system including ions of a metal that is a component of a subsequent layer of the multilayer system.

13. The method as recited in claim 12, wherein a layer of the multilayer system comprises at least one of the group consisting of a carbide layer, an oxide layer, and a nitride layer.

14. The method as recited in claim 12, wherein a layer of the multilayer system has one or more metallic components.

15. The method as recited in claim 14, wherein the layer of the multilayer system comprises at least one of the group consisting of Ti, Al, B, Si, TiAl, and AlCr.

16. The method as recited in claim 12, wherein a layer of the multilayer system is a layer of titanium nitride, titanium carbon nitride, titanium aluminum nitride, aluminum oxide, aluminum chromium oxide, boron nitride, or silicon nitride.

17. The method as recited in claim 12, wherein the introduced metal ions are a metallic component of the subsequent layer of the multilayer system.

18. The method as recited in claim 12, comprising letting reactive gas containing oxygen into the vacuum treatment system during the metal ion bombardment.

19. The method as recited in claim 12, comprising using targets for the metal ion bombardment, wherein the targets are composed of materials that are also used to synthesize an oxide layer.

20. The method as recited in claim 12, comprising using an alloy target for the metal ion bombardment.

21. The method as recited in claim 12, comprising selecting the bias voltage to ensure that a layer of the multilayer system has a high density and stress resulting from acceleration of the ions toward the substrate.

22. The method as recited in claim 12, comprising eliminating a working gas and carrying out the method in only a reactive gas.

* * * * *